United States Patent [19]
Kimura

[11] Patent Number: 5,878,052
[45] Date of Patent: Mar. 2, 1999

[54] METHOD AND HARDWARE ARRANGEMENT FOR REPLACING DEFECTIVE FUNCTION BLOCKS IN AN INTEGRATED CIRCUIT

[75] Inventor: Tohru Kimura, Tokyo, Japan

[73] Assignee: NEC Corporation, Tokyo, Japan

[21] Appl. No.: 796,392

[22] Filed: Feb. 4, 1997

Related U.S. Application Data

[63] Continuation of Ser. No. 311,786, Sep. 26, 1994, abandoned.

[30] Foreign Application Priority Data

Sep. 24, 1993 [JP] Japan .................... 5-237084

[51] Int. Cl.[6] .................................................. G11C 29/00
[52] U.S. Cl. ...................... 371/22.1; 371/10.3; 365/201
[58] Field of Search ................................ 371/22.1, 22.5, 371/22.6, 10.3, 10.2; 365/201, 189.05; 364/489, 490; 324/765

[56] References Cited

U.S. PATENT DOCUMENTS

| | | | |
|---|---|---|---|
| 4,546,454 | 10/1985 | Gupta et al. ............................. | 365/200 |
| 4,773,046 | 9/1988 | Akaogi et al. .......................... | 371/21.1 |
| 5,204,836 | 4/1993 | Reed ....................................... | 365/200 |
| 5,253,208 | 10/1993 | Kang ...................................... | 365/200 |
| 5,270,976 | 12/1993 | Tran ....................................... | 365/200 |
| 5,293,386 | 3/1994 | Muhmenthaler et al. ............. | 371/21.1 |
| 5,337,277 | 8/1994 | Jang ....................................... | 365/200 |
| 5,349,556 | 9/1994 | Lee ........................................ | 365/200 |
| 5,379,258 | 1/1995 | Murakami et al. .................... | 365/200 |
| 5,469,388 | 11/1995 | Park ....................................... | 365/200 |

*Primary Examiner*—Robert W. Beausoliel, Jr.
*Assistant Examiner*—Nadeem Iqbal
*Attorney, Agent, or Firm*—Whitham, Curtis & Whitham

[57] ABSTRACT

In order to enhance yield of chips, a block connector is provided in an integrated circuit including two function block groups. One group includes M+N first function blocks ($1<N<M$, $N\geq 3$) wherein N first function blocks are provided as redundant blocks. The other group includes M second function blocks. A block connector is provided for selectively coupling each of the M second function blocks to one of a plurality of first function blocks whose number ranges from 3 to N+1. Further, the block connector is capable of temporarily coupling all the first function blocks to the second function blocks for determining any defective block among the first function blocks before permanent connection of the two block groups.

7 Claims, 5 Drawing Sheets

METHOD AND HARDWARE ARRANGEMENT FOR REPLACING DEFECTIVE FUNCTION BLOCKS IN AN INTEGRATED CIRCUIT

This application is a continuation of U.S. patent application Ser. No. 08/311,786, filed on Sep. 26, 1994, now abandoned.

BACKGROUND OF THE INVENTION

1. Field of the Invention

The present invention relates generally to an integrated circuit which is provided with an improved method and hardware arrangement for substituting a redundant function block(s) for a defective one(s) during fabrication of the circuit. The block replacement is effectively implemented using improved block connection techniques.

2. Description of Related Art

It is a common practice to design an integrated circuit (IC) with redundant circuitry in order to enhance the yield of chips. The present invention is concerned with an integrated circuit which includes two function block groups. Each of these groups is composed of a plurality of function blocks with reiterative circuitry. The function blocks of one group are coupled to the function blocks of the other group on a one to one basis.

Before turning to the present invention it is deemed preferable to briefly discuss a conventional defective block replacement with reference to FIG. 1.

The arrangement of FIG. 1 includes first and second function block groups 10 and 12. The function blocks of the first group 10 are to be coupled to the function blocks of the second group 12 on a one to one basis via a switchable block connector 14.

It is assumed that the first function block group 10 is composed of a plurality processor blocks P1–P16, while the second function block group 12 is composed of a plurality of memory blocks M1–M20 which includes four redundant blocks in this case.

As is known, a memory block is composed of a plurality of memory cells each of which has extremely fine structure. Thus, the memory block is inevitably liable to induce defect as compared with the processor block. For this reason, the memory block group is provided with a plurality of redundant blocks.

Merely for the sake of discussion, it is assumed that there is no defective block in the processor block group, As shown, the switchable block connector 14 is configured such that each of the processor blocks P1–P16 is coupled to one of the two memory blocks. In the case shown in FIG. 1, two memory blocks M13 and M14 are not coupled to the switchable block connector 14.

The prior art has not given any suggestion that each processor block is coupled to more than two memory blocks. Thus, if a chip includes two adjacent defective memory blocks, there is no means for saving the chip.

SUMMARY OF THE INVENTION

It is an object of the present invention to provide improved defective block replacement techniques by which the yield of chips can effectively be raised without a complex block connector.

In brief, the above object is achieved by techniques wherein in order to enhance yield of chips, an improved block connector is provided in an integrated circuit including two function block groups One group includes M+N first function blocks (1<N<M, N≧3) wherein N first function blocks are provided as redundant blocks. The other group includes M second function blocks. A block connector is provided for selectively coupling each of the N second function blocks to one of a plurality of first function blocks whose number ranges from 3 to N+1. Further, the block connector is capable of temporarily coupling all the first function blocks to the second function blocks for determining any defective block among the first function blocks before permanent connection of the two block groups.

An aspect of the present invention resides in an integrated circuit, comprising: first function block group which includes M+N first function blocks (1<N<M, N≧3) wherein N first function blocks are provided as redundant blocks; second function block group which includes X second function blocks; and a block connector provided for selectively coupling each of the M second function blocks to one of a plurality of first function blocks whose number ranges from 3 to N+1.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

In order to effectively enhance the chip yields, it is necessary to make the best use of the redundant memory blocks already provided on a chip. To this end, the design of a switchable block connector becomes very important.

The number of redundant blocks should carefully be determined in view of the chip layout, chip size, etc. However, this is not directly concerned with the present invention and will not be referred to in the instant disclosure.

Prior discussing a first embodiment of the present invention, a principle underlying the instant invention will first be discussed.

It is not possible to predict the number of defective memory blocks before checking a chip. However, merely for the convenience of discussion, it is assumed that the maximum number of defective memory blocks is N. In this case, it is sufficient if each processor block is connectable to (N+1) memory blocks. In other words, even if the switchable block connector is designed such as to couple each processor block to more than N+2 memory blocks, the chip saving (viz., the yield) is not improved.

It is assumed that the number of memory blocks is (p+N) wherein N depicts the number of redundant memory blocks as mentioned above. Thus, the memory blocks are depicted by M1, M2, . . . , Mp, M(p+1), M(p+2), . . . , M(p+N), while the processor blocks are depicted by P1, P2, . . . , Pp.

Assume, for example, that the memory blocks M1–Mn (n<p) are perfect or non-defective. In such a case, the processor blocks P1–Pn are respectively connected to the memory blocks M1–Mn. On the other hand, if the memory block M(n+1) is found defective, the processor block P(n+1) is connected to the next memory block M(n+2) if it is perfect. Similarly, if the two consecutive memory blocks M(n+1) and M(n+2) are defective, it is necessary to check if the processor block P(n+1) can be connected to the memory block M(n+3). It is understood that if the memory blocks M(n+1)–M(n+N) are defective, the processor block P(n+1) is coupled to the memory block M(n+N+1) (it is assumed that this memory block is perfect). The number of defective memory blocks and the location thereof are not previously specified and thus, it is necessary that the switchable block connector should be designed such that the processor block Pn can be connected to the memory block Mn.

From the foregoing it is appreciated that if a given processor block can be coupled to N redundant memory blocks besides to the memory block which is to be selected if no defective memory block exists, an arrangement for the block coupling is sufficient. In other words, it is ideal or most desirable if a given processor block Pu can be coupled to one of the memory blocks Mn–M(n+N).

Figure 2A:
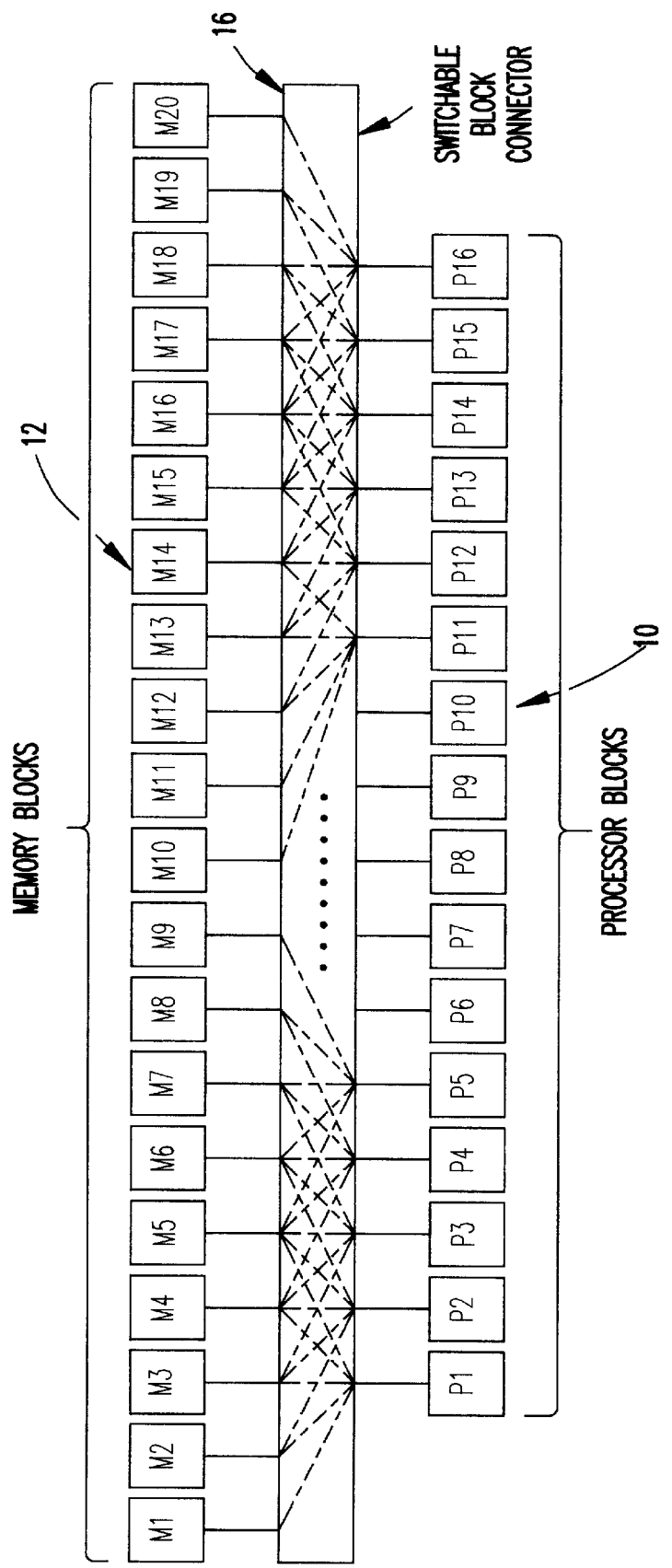
FIG. 2A is a block diagram showing one example of the present invention.

FIG. 2A shows one example of the above mentioned underlying principle of the present invention in the case of N=4.

However, it is sometimes practically difficult to design an IC chip to satisfy the above mentioned ideal block coupling arrangement due to bus layout, increased hardware complexity of the switchable block connector, etc. Thus, it is occasionally preferable to reduce the number of the memory blocks, to which one processor block is connectable, to less than (N+1) in consideration of competing requirements of hardware complexity and the yield of chips.

Figure 1:
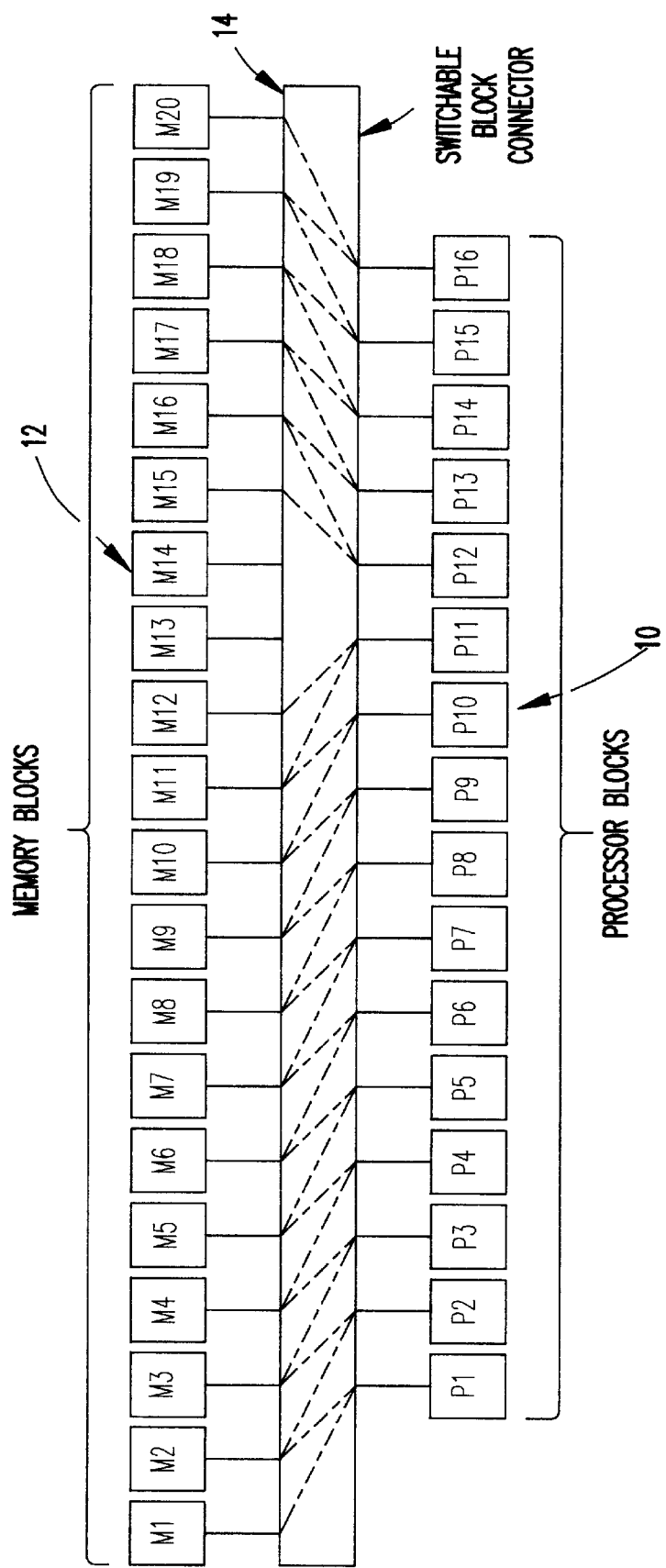
FIG. 1 is a diagram schematically showing an arrangement of two function block groups which are electrically coupled using a switchable block connector, having been referred to in the opening paragraphs of the instant disclosure.
Figure 2B:
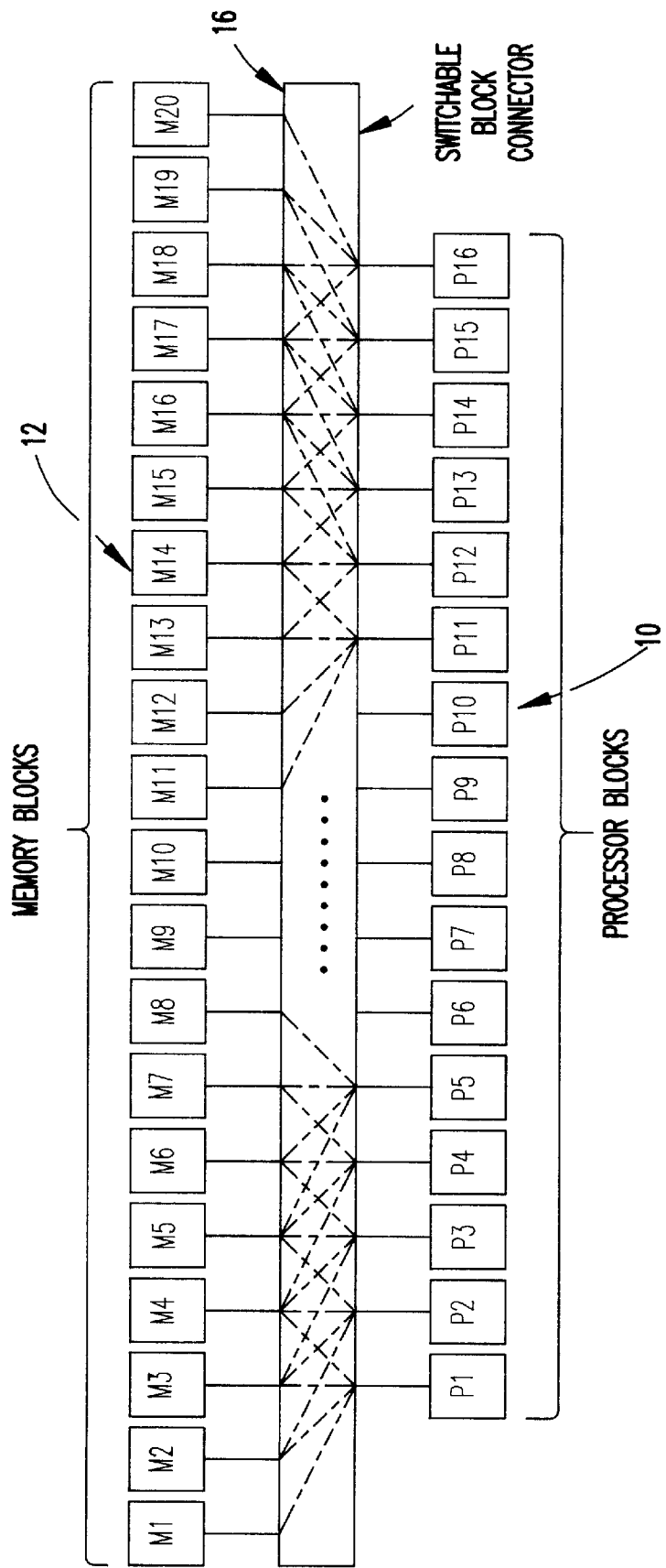
FIG. 2B is a diagram schematically showing a first embodiment of the present invention.

FIG. 2B is a schematic diagram showing a first embodiment of the present invention. As shown, the processor blocks 10 are interconnected to the memory blocks 12 using a switchable block connector 16. The number of redundant memory blocks (N) is four as in the prior art discussed in the opening paragraphs of the instant disclosure. In the first embodiment, each of the processor blocks P1–P16 is connectable to N memory blocks via the switchable block connector 16. In more specific terms, one of the processor blocks P1–P11, denoted by Pn (n=1, 2, . . . 11), is connectable to the memory blocks Mn–M(n+3), while one of the processor blocks P12–P16, denoted by Pn (n=12, . . . , 16), is connectable to the memory blocks M(n+1)–M(n+4). In order to show the advantage of the first embodiment over the prior art shown in FIG. 1, the following table is given.

TABLE

| A | B | C | D |
|---|---|---|---|
| 0 | 1 | 0 | 0 |
| 1 | 20 | 0 | 0 |
| 2 | 190 | 19 | 0 |
| 3 | 1140 | 171 | 0 |
| 4 | 4845 | 969 | 17 |
| Total | 6169 | 1159 | 17 |

In the above table, column "A" indicates the number of defective memory blocks, column "B" indicating the number of possible combinations of processor and memory blocks, column "C" indicating the number of combinations each of which is impossible to save a chip with the prior art shown in FIG. 1, and column "D" indicating the number of combinations each of which is impossible to save a chip with the arrangement shown in FIG. 2B.

As mentioned above, the number of the redundant memory blocks is four in the first embodiment and thus it is desirable to configure the block connector 16 such as to couple each of the processor blocks to "five" memory blocks. However, in order to meet practical requirements for reducing the space occupied by the block connector 16 and the fabrication complexity induced by increased buses in the connector 24, the connector 24 is arranged such that each of the processor blocks is connectable to "four" memory blocks instead of "five". Thus, as shown in Table, there are 17 block combinations wherein the chip is unable to be saved if four memory blocks are defective (viz., A=4). However, according to the first embodiment, the number of such undesirable block combinations in the case of A=4 is markedly reduced as compared with the prior art. That is, in the case of the four defective memory blocks, the prior art shown in FIG. 1 inherently includes 969 possible block combinations wherein the chip is no longer saved.

The circuit arrangement of the switchable block connector 16 will be described.

Figure 3:
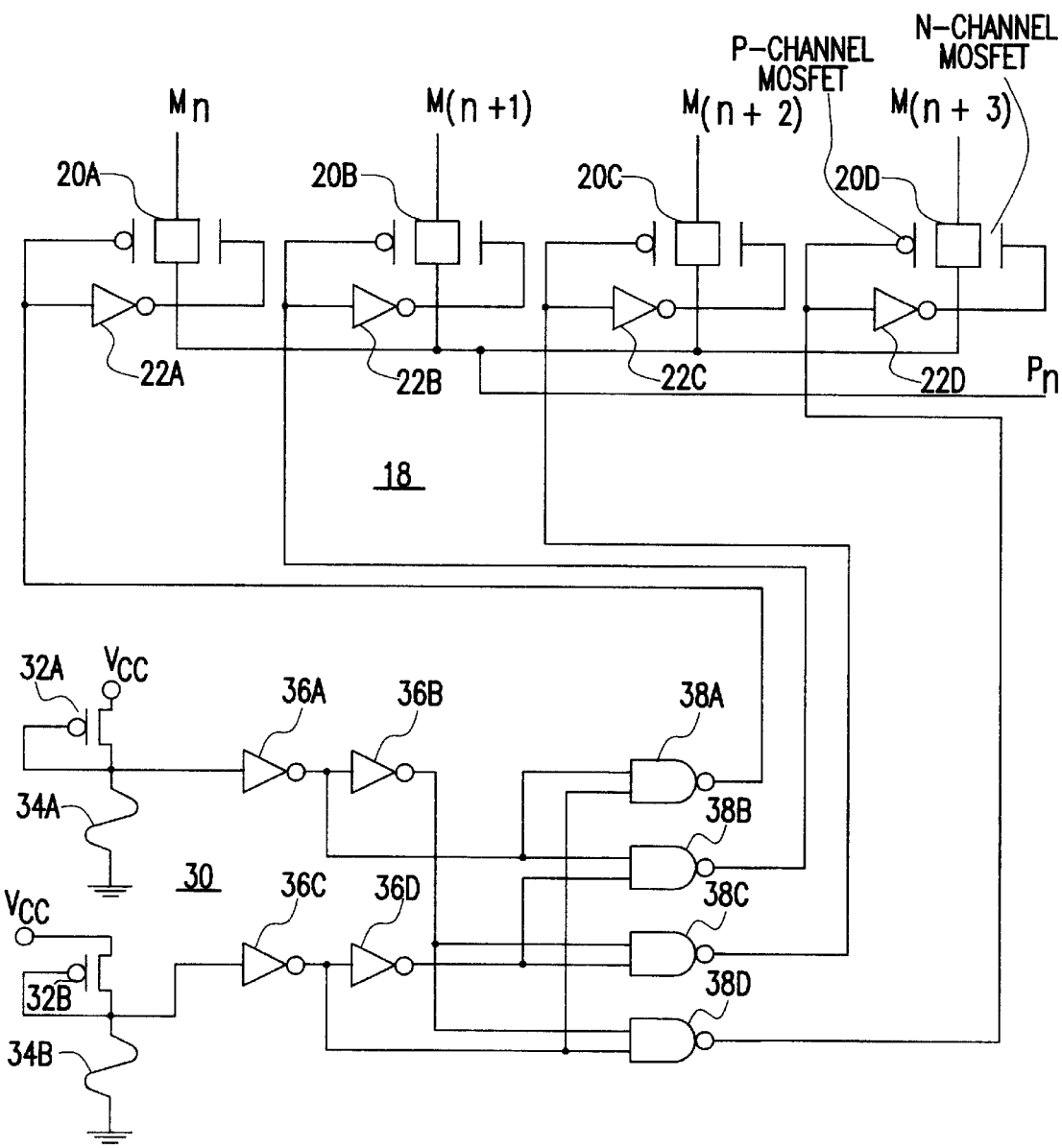
FIG. 3 is a block diagram showing part of a switchable block connector which has been devised in the process of reaching the present invention.

FIG. 3 is a block diagram showing part of the switchable block connector 16. This circuit was devised by the inventor during working on the present invention. Although the arrangement of FIG. 3 has proven impractical as mentioned below, it is deemed preferable to discuss the same for a better understanding of the circuit of FIG. 4.

The circuit shown in FIG. 3 generally includes a switch section 18 and a switch control section 30. The switch section 18 includes four switches 20a–20d each of which consists of p-channel and n-channel MOSFET (Metal Oxide Semiconductor Field Effect Transistor) switches. The switches 20a–20d are provided between the processor block Pn and the memory blocks Mn–M(n+3) when n≦11. On the other hand, although not shown in FIG. 3, the switches 20a–20d are provided between the processor block Pn and the memory blocks M(n+1)–M(n+4) when 12<n≦16 as clearly understood from FIG. 2. Each of the switches 20a–20d is rendered open when a logic "1" (viz., high level voltage) is applied to the gate electrodes thereof. On the other hand, each of the switches 20a–20d is closed when a logic "0" (viz., low level voltage) is applied to the gate electrodes thereof. Each of inverters 22a–22d reverses a logic level applied to one gate of the corresponding switches 20a–20d.

The switch control section 30 includes two MOSFETs 32a and 32b, two fusible members (or fuses) 34a and 34b, four inverters 36a–36d, and four NAND gates 38a–38d, all of which are coupled as shown.

When both of the fusible members 34a and 34b are not fused or broken, a logic "0" is applied to the inverters 36a and 36b. In this instance, the NAND gate 38a outputs a logic "0" while each of the remaining NAND gates 38b, 38c and 38d issues a logic "1". Thus, the switch 20a is rendered closed whereby the processor block Pn is connected to the memory block Mn. On the other hand, when the fusible member 34a is fused using laser or other techniques while the other member 34b is not fused, only the NAND gate 38d issues a logic "0". Therefore, the processor block Pn is connected to the memory block M(n+3). Further, when the fusible members 34a and 34b are both fused, only the NAND gate 38c issues a logic "0" and thus, the processor block Pn is connected to the memory block M(n+2) in this case.

Since the fusible member 34a (or 34b) is irrecoverably broken, it is not possible to connect the processor block Pn to the memory block X(n+1) if the fusible member 34a is first fused.

Contrarily, in the event that the fusible member 34b is first fused, the NAND gate 38b generates a logic "0" and thus, the processor block Pn is connected to the memory block M(n+1) in this case. However, it will be readily appreciated that if the fusible member 34b is first fused, the NAND gate 38d is in turn unable to issue a logic "0". Accordingly, the processor block Pn is unable to be coupled to the memory block M(n+3).

Figure 4:
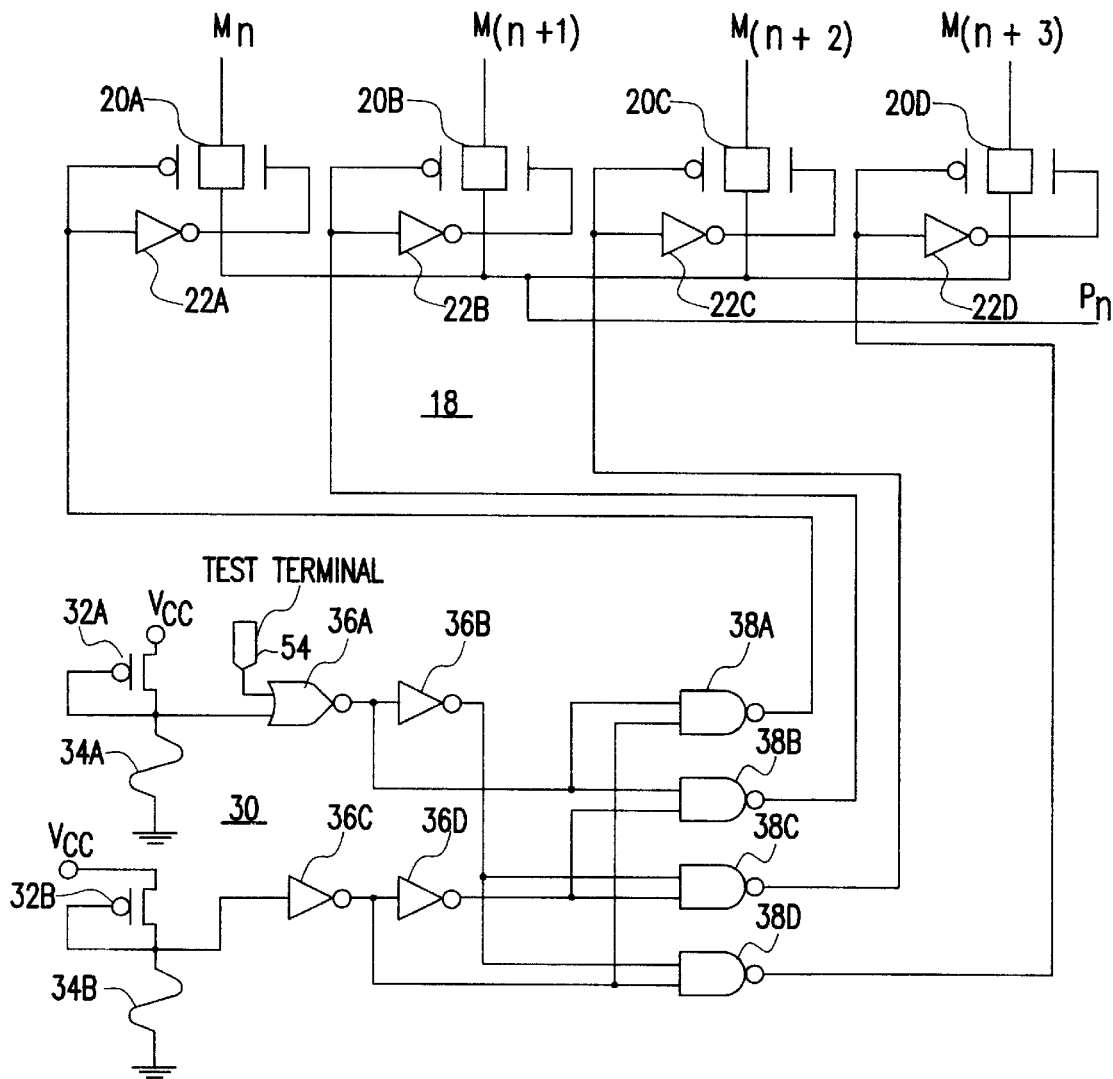
FIG. 4 is a block diagram showing part of a switchable block connector in accordance with the present invention.

FIG. 4 is a block diagram showing part of the switchable block connector 16 which is able to overcome the aforesaid problems.

The arrangement of FIG. 4 differs from that of FIG. 3 in that the former arrangement includes an NOR gate 50 in place of the inverter 36a. Further, the circuit elements 36b–36c and the NOR gate 50 are coupled to the NAND gates 38a–38d in a manner which is different from the arrangement of FIG. 3. Other than these, the arrangement of FIG. 4 is the same as that of FIG. 3.

In the event that the NOR gate 50 is supplied with a logic "1" via a test terminal 54 while the fusible members 34a and 34b are not fused, only the NAND gate 38a issues a logic "0". Thus, the processor block Pn is connected to the memory block Mn. On the other hand, the NOR gate 50 is supplied with a logic "0" via the test terminal 54 while the fusible members 34a and 34b are not fused, only the NAND gate 38d issues a logic "0". Thus, the processor block Pn is connected to the memory block M(n+3).

As mentioned above, FIG. 4 shows part of the switchable block connector 16 by which the processor block Pn is coupled to one of the memory blocks Mn–M(n+3) when n≦11. On the other hand, although not shown in FIG. 4, the switches 20a–20d are provided between the processor block Pn and the memory blocks M(n+1)–M(n+4) when 12<n≦16 as clearly understood from FIG. 2. The overall arrangement of the connector 16 includes sixteen circuits each of which is identical with the circuit shown in FIG. 4. Accordingly, if a logic "1" is applied to the test terminal 54 of each of the above mentioned sixteen circuits, the processor blocks P1–P16 are respectively coupled to the memory blocks M1–M16 at the same time. It is therefore possible to determine whether or not each of the memory blocks M1–M16 is defective using a suitable test method which is irrelevant to the instant invention. On the other hand, if a logic "0" is applied to the test terminal 54 of each of the above mentioned sixteen circuits, the processor blocks P1–P16 are respectively coupled to the memory blocks M4–M20 at the same time. It is therefore possible to determine whether or not each of the memory blocks M4–M20 is defective using the above mentioned suitable memory block test.

This means that each of the memory blocks M1–M20 can be checked as to whether or not it is defective before fusing any of the fusing members 34a and 34b. After specifying a defective memory block(s) (if any), each of the processor blocks P1–P16 is permanently coupled to a non-defective memory block. This is implemented by fusing or non-fusing of either or both of the fusible elements 34a and 34b. In this case, the test terminal 54 may be connected to a reference voltage source such as to be constantly supplied with a logic "1" or "0".

It will be understood that the above disclosure is only representative of two possible embodiments of the present invention and that the concept on which the present invention is based is not specifically limited thereto.

What is claimed is:

1. An integrated circuit, comprising:
   a first function block group including M+N first function blocks, where 1<N<M, and N≧3, and wherein N represents redundant ones of said first function blocks;
   a second function block group including M second function blocks;
   a block connector for selectively coupling each of said M second function blocks to one of a maximum of N+1 first function blocks among said M+N first function blocks, wherein said block connector comprises a plurality of block connecting sections, each of said plurality of block connecting sections comprising:
   a maximum of N+1 switches provided between N+1 first function blocks and one of said second function blocks;
   a maximum of N+1 logic means, respectively coupled to said N+1 switches, for issuing a block connection signal for coupling said one of said second function blocks to one of said N+1 first function blocks; and
   controller means, coupled to control said N+1 logic means, for controlling said logic means to issue said block connection signal,
   wherein each one of said block connecting sections of said block connector comprises a plurality of fusible members and controls said N+1 logic means to issue said block connection signal depending on whether said fusible members are in a fused state or a non-fused state and depending on a logic level of a test signal applied to said controller.

2. An integrated circuit as claimed in claim 1, wherein each one of said block connecting sections receives, prior to fusing any of said fusible members, said test signal for coupling one of said N+1 first function blocks to said one of said second function blocks to allow each first function block to undergo a block defect check before permanent connection of one of said N+1 first function blocks to said one second function block.

3. An integrated circuit, comprising:
   a first function block group including M+N first function blocks, where 1<N<M, N≧3, and wherein N first function blocks are redundant blocks;
   a second function block group including M second function blocks; and
   a block connector including a plurality of block connecting sections, each of which comprises:
   a maximum of N+1 switches provided between N+1 first function blocks and one of said second function blocks,
   a maximum of N+1 logic means, respectively coupled to said N+1 switches, for issuing a block connection signal for coupling said one of said second function blocks to one of said N+1 first function blocks, and
   a controller coupled to control said N+1 logic means to control said block connection signal,
   wherein each block connecting section of said block connector includes a plurality of fusible members and controls said N+1 logic means to issue said block connection signal depending on whether said fusible members are in a fused state or a non-fused state and depending on a logic level of a test signal applied to said controller, and
   wherein each block connecting section of said block connector receives, before fusing any of said fusible members, said test signal for coupling one of said N+1 first function blocks to said one of said second function blocks to allow each first function block to undergo a block defect check before permanent connection of one of said N+1 first function blocks to said one of said second function blocks.

4. An integrated circuit as recited in claim 1, wherein said block connector comprises:

a maximum of N+1 switches provided between N+1 first function blocks and one of said second function blocks, each of said switches comprising a P-channel MOSFET and an N-channel MOSFET connected in parallel;

a maximum of N+1 logic gates, respectively coupled to said N+1 switches, for issuing a block connection signal for coupling said one of said second function blocks to one of said N+1 first function blocks; and a plurality of fusible members connected to said logic gates through a combinational network, said plurality of fusible members for causing only one of said N+1 logic gates to activate one of said N+1 switches.

5. An integrated circuit as recited in claim 4, wherein said combinational logic comprises a NOR gate means having a first input terminal connected to one of said plurality of fusible members and a second input terminal connected to a test signal terminal.

6. An integrated circuit, comprising:

a first function block group including M+N first function blocks, where 1<N<M, and N≧3, and wherein N represents redundant ones of said first function blocks;

a second function block group including M second function blocks;

a block connector for selectively coupling each of said M second function blocks to one of a maximum of N+1 first function blocks among said M+N first function blocks, wherein said block connector comprises a plurality of block connecting sections, each of said plurality of block connecting sections comprising:

a maximum of N+1 switches provided between N+1 first function blocks and one of said second function blocks;

a maximum of N+1 logic means, respectively coupled to said N+1 switches, for issuing a block connection signal for coupling said one of said second function blocks to one of said N+1 first function blocks; and controller means, coupled to control said N+1 logic means, for controlling said logic means to issue said block connection signal, wherein each one of said block connecting sections of said block connector comprises a plurality of fusible members and controls said N+1 logic means to issue said block connection signal depending on whether said fusible members are in a fused state or a non-fused, and wherein each one of said block connecting sections receives, prior to fusing any of said fusible members, said test signal for coupling one of said N+1 first function blocks to said one of said second function blocks to allow each first function block to undergo a block defect check before permanent connection of one of said N+1 first function blocks to said one second function block.

7. An integrated circuit as recited in claim 6 wherein each of said N+1 switches comprises an N-channel and a P-channel MOSFET.

* * * * *